United States Patent
Shalev et al.

(10) Patent No.: US 11,003,812 B2
(45) Date of Patent: May 11, 2021

(54) EXPERIENCE DRIVEN DEVELOPMENT OF MIXED REALITY DEVICES WITH IMMERSIVE FEEDBACK

(71) Applicant: Microsoft Technology Licensing, LLC, Redmond, WA (US)

(72) Inventors: Emanuel Shalev, Sammamish, WA (US); Yuri Pekelny, Seattle, WA (US); Pedro Urbina Escos, Seattle, WA (US)

(73) Assignee: Microsoft Technology Licensing, LLC, Redmond, WA (US)

(*) Notice: Subject to any disclaimer, the term of this patent is extended or adjusted under 35 U.S.C. 154(b) by 378 days.

(21) Appl. No.: 16/197,297

(22) Filed: Nov. 20, 2018

(65) Prior Publication Data
US 2020/0159875 A1 May 21, 2020

(51) Int. Cl.
*G06F 30/20* (2020.01)
(52) U.S. Cl.
CPC .................... *G06F 30/20* (2020.01)
(58) Field of Classification Search
CPC .................... G06F 30/20; G06T 19/006
See application file for complete search history.

(56) References Cited

U.S. PATENT DOCUMENTS

| 7,813,910 | B1 | 10/2010 | Poulin |
| 8,019,588 | B1 | 9/2011 | Wohlberg et al. |
| 8,239,840 | B1 | 8/2012 | Czymontek |
| 9,152,541 | B1 | 10/2015 | Kuo et al. |

OTHER PUBLICATIONS

"International Search Report Issued in PCT Application No. PCT/US19/061058", dated Jan. 29, 2020, 12 Pages.
Protalinski, Emil, "Microsoft launches HoloLens emulator so developers can test holographic apps, no headset required", Retreived from: https://venturebeat.com/2016/03/30/microsoft-launches-hololens-emulator-so-developers-can-test-holographic-apps-no-headset-required/, Mar. 30, 2016, 25 Pages.

*Primary Examiner* — Anthony Ho

(57) ABSTRACT

A feedback loop, for experience driven development of mixed reality (MR) devices, simulates application performance using various synthetic MR device configurations. Examples display, using an application, a virtual object on a first MR device, during a recording session; record, during the recording session, sensor data from the first MR device; simulate sensor data, based at least on the recorded sensor data, for the virtual object on simulated MR devices having various configurations of simulated sensors, during simulation sessions; and generate displays, using the application, of the virtual object on the simulated MR devices, during playback sessions. Some examples further collect recording key performance indicator (KPI) data during the recording session; collect simulation KPI data during the simulation sessions; compare the simulation KPI data with the recording KPI data to produce simulation KPI comparison data sets; and collect playback key performance indicator (KPI) data during the playback sessions.

20 Claims, 8 Drawing Sheets

EXPERIENCE DRIVEN DEVELOPMENT OF MIXED REALITY DEVICES WITH IMMERSIVE FEEDBACK

BACKGROUND

Advanced virtual reality (VR), augmented reality (AR) and mixed reality (MR), collectively MR, applications may be demanding on MR hardware devices. When an MR software application (app) is developed prior to the availability of hardware for testing, there is a risk that the app may not run satisfactorily on the MR hardware devices when they do become available. Waiting for the availability of the MR hardware devices prior to developing the MR app, however, may introduce undesirable delay. The alternative is that hardware designers must speculate as to the minimum hardware requirements.

SUMMARY

The disclosed examples are described in detail below with reference to the accompanying drawing figures listed below. The following summary is provided to illustrate some examples disclosed herein. It is not meant, however, to limit all examples to any particular configuration or sequence of operations.

A feedback loop, for experience driven development of mixed reality (MR) devices, simulates application performance using various synthetic MR device configurations. Examples display, using an application, a virtual object on a first MR device, during a recording session; record, during the recording session, sensor data from the first MR device; simulate sensor data, based at least on the recorded sensor data, for the virtual object on simulated MR devices having various configurations of simulated sensors, during simulation sessions; and generate displays, using the application, of the virtual object on the simulated MR devices, during playback sessions. Some examples further collect recording key performance indicator (KPI) data during the recording session; collect simulation KPI data during the simulation sessions; compare the simulation KPI data with the recording KPI data to produce simulation KPI comparison data sets; and collect playback key performance indicator (KPI) data during the playback sessions.

Some aspects disclosed herein are directed to A system for simulating an MR device, the system comprising: a processor; and a computer-readable medium storing instructions that are operative when executed by the processor to: display, using an application, a virtual object on a first MR device, during a recording session; record, during the recording session, sensor data from the first MR device; simulate sensor data, based at least on the recorded sensor data, for the virtual object on a simulated MR device having simulated sensors, during a simulation session; and generate a display, using the application, of the virtual object on the simulated MR device, during a playback session.

BRIEF DESCRIPTION OF THE DRAWINGS

The disclosed examples are described in detail below with reference to the accompanying drawing figures listed below.

Corresponding reference characters indicate corresponding parts throughout the drawings.

DETAILED DESCRIPTION

Figure 1:
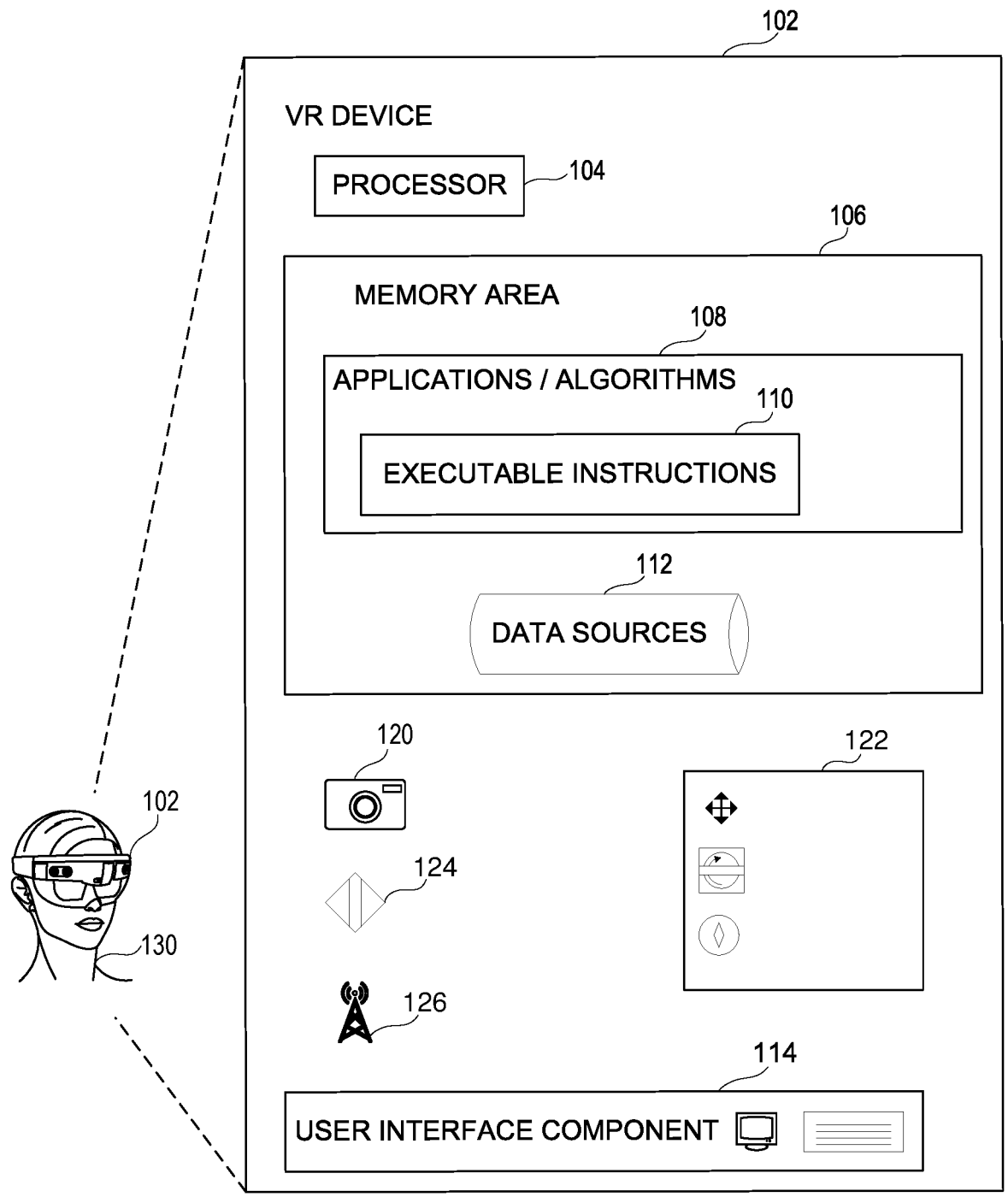
FIG. 1 is a block diagram of an example mixed reality (MR) device, according to some of the various examples disclosed herein.

The various examples will be described in detail with reference to the accompanying drawings. Wherever possible, the same reference numbers will be used throughout the drawings to refer to the same or like parts. References made throughout this disclosure relating to specific examples and implementations are provided solely for illustrative purposes but, unless indicated to the contrary, are not meant to limit all examples.

Advanced virtual reality (VR), augmented reality (AR) and mixed reality (MR), collectively MR, applications may be demanding on MR hardware devices. When an MR software application (app) is developed prior to the availability of hardware for testing, there is a risk that the app may not run satisfactorily on the MR hardware devices when they do become available. Waiting for the availability of the MR hardware devices prior to the development of the MR app, however, may introduce undesirable delay.

An immersive feedback loop, for experience driven development of MR devices, simulates application performance using various synthetic MR device configurations. Examples display, using an application, a virtual object on a first MR device, during a recording session; record, during the recording session, sensor data from the first MR device; simulate sensor data, based at least on the recorded sensor data, for the virtual object on simulated MR devices having various configurations of simulated sensors, during simulation sessions; and generate displays, using the application, of the virtual object on the simulated MR devices, during playback sessions. Some examples further collect recording key performance indicator (KPI) data during the recording session; collect simulation KPI data during the simulation sessions; compare the simulation KPI data with the recording KPI data to produce simulation KPI comparison data sets; and collect playback key performance indicator (KPI) data during the playback sessions.

Rather than build a new real world MR device, then build an app, and then test the combination to find out whether it works, the immersive feedback loop permits building the app first, collecting and recording high-fidelity sensor data, spoiling the recorded sensor data to lower resolution, lower accuracy, and/or higher noise to simulate less expensive sensors, and ascertaining performance of the app with the simulated configuration. Once the designers have experience with various simulated MR configurations, that experience can drive the design and development of the new hardware MR device, for example by identifying minimum requirements. The minimum requirements may include what sensors are required, what specifications the noise level, resolution, and accuracy must meet, and possibly where the sensors should be located. Thus, the immersive feedback loop permits experience driven development, even when the actual hardware does not arrive until later. This speeds the hardware and algorithms development process, when compared with a process that includes hardware development prior to app development.

The loop begins with the development of the user experience (MR app), for example an app to collect a mesh of an object. A virtual world or a synthetic object is viewed using an actual ("real world") MR device with high resolution sensors. For example, perhaps the sensitivity of the experience to jarring action is to be ascertained. MR device position and orientation are often more difficult to detect when the MR device is experiencing rapid, jerky, or irregular motion. So, if an MR device is to be designed in order to operate under such circumstances, it is desirable to test candidate device configurations to ascertain which configurations will permit the app to operate acceptably. To set up the tests, a user may wear an MR device while running on a treadmill, in order to produce stress test sensor data. Sensors in the MR device, such as a headset, or on a body suit, measure the movement and acceleration forces. Sensors, such as audio and visual (camera), infrared (IR), distance (stereo camera or other), accelerometer, and gyroscope may be used. The sensor readings are recorded for later use in simulations. The same virtual world and algorithms, such as computer vision (CV) algorithms, are used in the original sensor recording, and the simulation, in order to preserve fidelity.

FIG. 1 is a block diagram of an example MR device 102, which may be a real-world device or a simulated device, and may be a VR or AR device. MR device 102 is illustrated as a headset, but other examples include alternative devices. MR device 102 may alternatively take the form of a mobile computing device or any other portable device. In some examples, a mobile computing device includes a mobile telephone, laptop, tablet, computing pad, netbook, gaming device, wearable device, head mounted display (HMD) and/or portable media player. MR device 102 may also represent less portable devices such as desktop personal computers, kiosks, tabletop devices, industrial control devices, wireless charging stations, electric automobile charging stations, and other physical objects embedded with computing resources and/or network connectivity capabilities. Additionally, MR device 102 may represent a group of processing units or other computing devices, such as for example a combination of a desktop personal computer and an HMD in communication with the desktop personal computer. Although MR device 102 is illustrated as a single untethered device, it is common for some VR devices to leverage external machines for processing capacity.

In some examples, MR device 102 has at least one processor 104, a memory area 106, and at least one user interface component 114. These may be the same or similar to processor(s) 714 and memory 712 of FIG. 7, respectively. Processor 104 includes any quantity of processing units, and is programmed to execute computer-executable instructions for implementing aspects of the disclosure. The instructions may be performed by the processor 104 or by multiple processors within MR device 102, or performed by a processor external to MR device 102. In some examples, processor 104 is programmed to execute instructions such as those that may be illustrated in the others figures. In some examples, processor 104 represents an implementation of analog techniques to perform the operations described herein. For example, the operations may be performed by an analog computing device and/or a digital computing device.

MR device 102 further has one or more computer-storage media represented as memory area 106. Memory area 106 includes any quantity of computer-storage media associated with or accessible by the computing device. Memory area 106 may be internal to MR device 102 (as shown in FIG. 1), external to the computing device (not shown), or both (not shown). In some examples, memory area 106 includes read-only memory and/or memory wired into an analog computing device. Memory area 106 stores, among other data, one or more applications or algorithms 108 that include both data and executable instructions 110. Applications 108, when executed by the processor, operate to perform functionality on the MR device 102. Exemplary applications include AR, VR, and MR display and sensing of pose, gaze, movements, or other positioning for field of view control. Applications 108 may communicate with counterpart applications or services such as web services accessible via a network. For example, applications 108 may represent downloaded client-side applications that correspond to server-side services executing in a cloud. In some examples, applications 108 are be configured to communicate with data sources and other computing resources in a cloud environment during runtime, or share and/or aggregate data between client-side services and cloud services. Additionally or alternatively, memory area 106 may store data sources 112, which may represent data stored locally at memory area 106, data access points stored locally at memory area 106 and associated with data stored remote from MR device 102, or any combination of local and remote data.

User interface component 114, may include instructions executed by processor 104 of MR device 102, and cause processor 104 to perform operations, including to receive user selections during user interaction with applications 108, for example. Portions of user interface component 114 may thus reside within memory area 106. In some examples, user interface component 114 includes a graphics card for displaying data to a user 130 and receiving data from user 130. User interface component 114 may also include computer-executable instructions (e.g., a driver) for operating the graphics card. Further, some examples of user interface component 114 include a display (e.g., a touch screen display or natural user interface) and/or computer-executable instructions (e.g., a driver) for operating the display. In some examples the display is be a three dimensional (3D) display, such as may be found in an HMD. User interface component 114 may also include one or more of the following to provide data to the user or receive data from the user: a keyboard (physical or touchscreen display), speakers, a sound card, a camera, a microphone, a vibration motor, one or more accelerometers, a Bluetooth™ brand communication module, global positioning system (GPS) hardware, and a photoreceptive light sensor. For example, the user may input commands or manipulate data by moving the computing device in a particular way. In another example, the user may input commands or manipulate data by providing a gesture detectable by the user interface component, such as a touch or tap of a touch screen display or natural user interface.

As illustrated, MR device 102 further includes a camera 120, which may represent a single camera, a stereo camera set, a set of differently-facing cameras, or another configuration. In some examples, the position and orientation of MR device 102 is sensed or measured in order to control a display. To facilitate such measurements, the illustrated example of MR device 102 further includes an inertial measurement unit (IMU) 122 that incorporates one or more of an accelerometer, a gyroscope, and/or a magnetometer. The accelerometer gyroscope, and/or a magnetometer may each output measurements in 3D. The combination of 3D position and 3D rotation may be referred to as six degrees-of-freedom (6DoF), and a combination of 3D accelerometer and 3D gyroscope data may permit 6DoF measurements. In general, linear accelerometer data may be the most accurate of the data from a typical IMU, whereas magnetometer data may be the least accurate.

As also illustrated, MR device 102 additionally includes a generic sensor 124 and a transceiver 126. Various examples of generic sensor 124 include an audio sensor (such as a microphone), an infrared (IR) sensor, a light detection and ranging (LIDAR) sensor, an RGB-D sensor, an ultrasonic sensor, or any other sensor, including sensors associated with position-finding and range-finding. Transceiver 126 may include Bluetooth™, WiFi, cellular, or any other radio or wireless system. Transceiver 126 is able to act as a sensor by detecting signal strength, direction-of-arrival and location-related identification data in received signals. Together, one or more of camera 120, IMU 122, generic sensor 124, and transceiver 126 collect data for use in MR applications.

Figure 2:
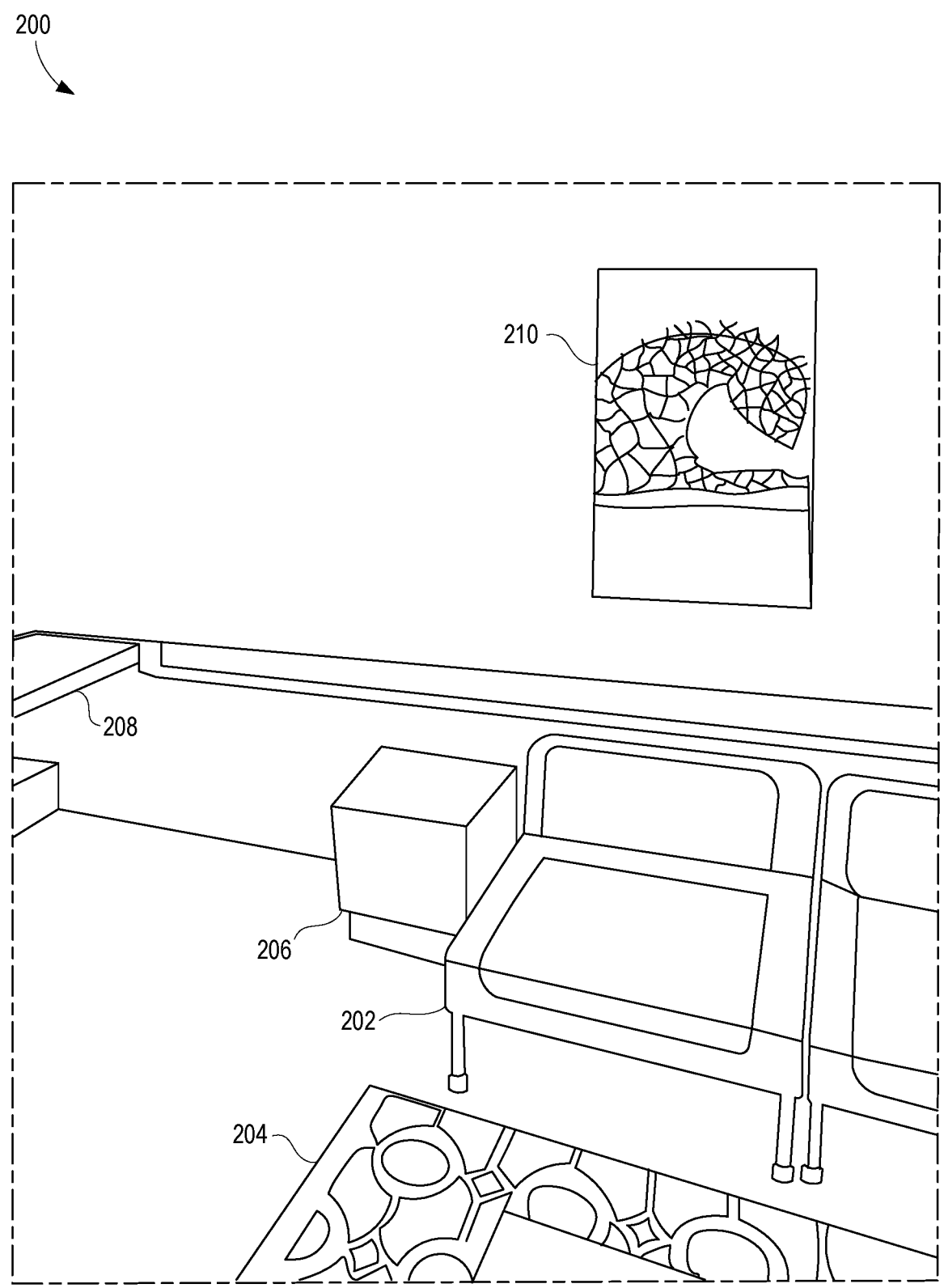
FIG. 2 is an example MR scene, as may be displayed on the MR device of FIG. 1.

FIG. 2 is an example MR scene 200, as may be displayed on MR device 102 of FIG. 1 and is part of an example virtual world that may be used by the immersive feedback loop. MR scene 200 includes a couch 202, a rug 204, a table 206, a counter 208, and a detailed artwork 210. The ground truth (GT) used to generate scene 200, such as the locations of all of couch 202, rug 204, table 206, counter 208, and artwork 210. Thus, if the positions are rendered incorrectly, the error can be calculated as a key performance indicator (KPI).

Figure 3:
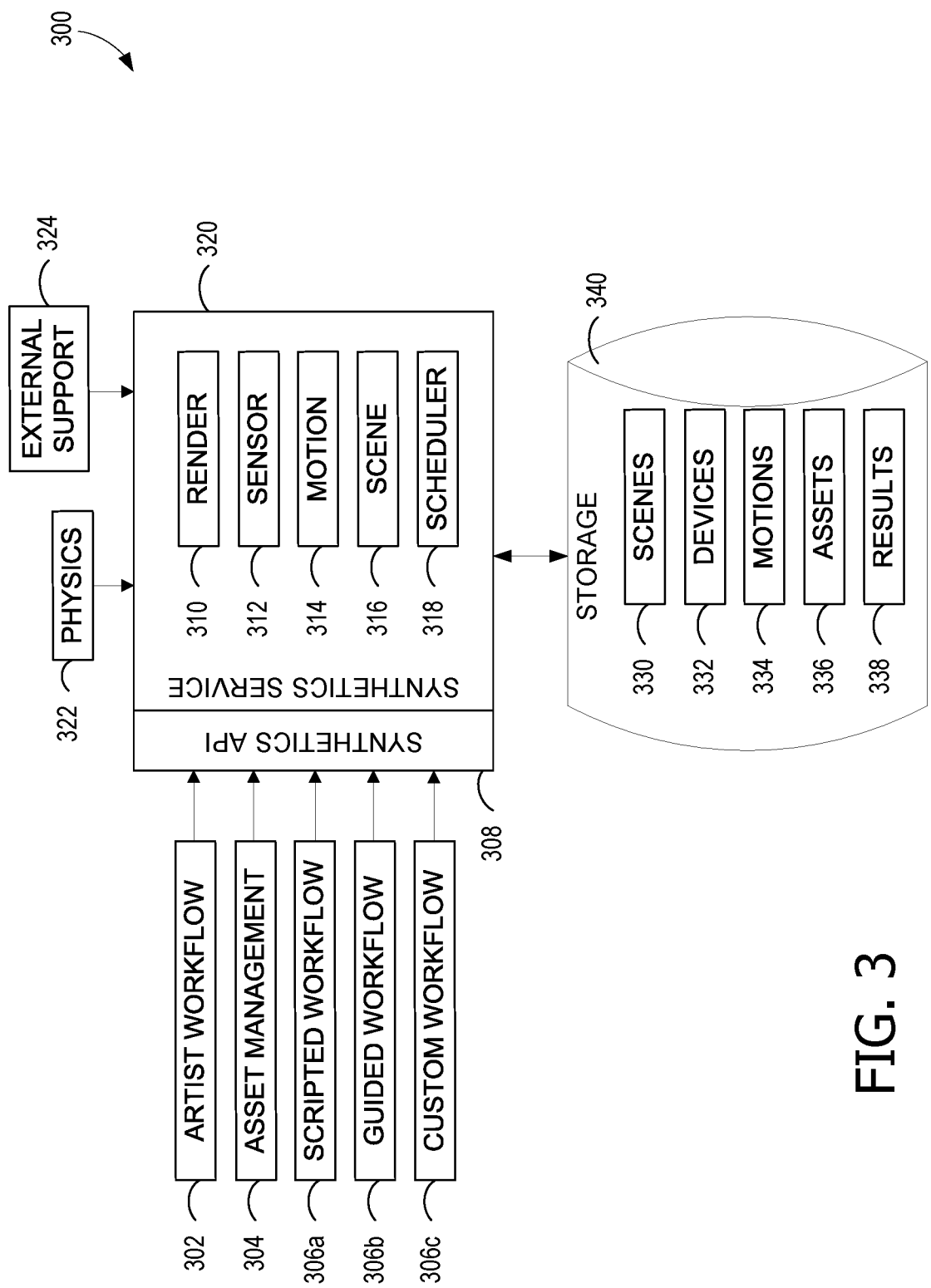
FIG. 3 is a block diagram of an architecture for creating synthetic imagery, according to some of the various examples disclosed herein.

FIG. 3 is a block diagram of an architecture 300 for creating synthetic imagery, and may be used, for example, to generate MR scene 200. In architecture 300, several inputs, including an artist workflow 302, an asset management 304, and other workflows (a scripted workflow 306*a*, a guided workflow 306*b*, and a custom workflow 306*c*) interface via a synthetics application programming interface (API) 308 to a synthetics service 320. Synthetics service 320 has multiple components or modules, including a renderer 310, a sensor modeler 312, a motion module 314, a scene generation module 316, and a scheduler 318. External functionality is illustrated as a physics service 322 and other external support 324, which may include off-loaded rendering computations. It should be understood that different functionalities may be internal or external services, and that FIG. 3 is only used for illustrative purposes. Synthetics service 320 includes at least these main core capabilities:

Asset ingestion, which includes artist workflows and, if a user desires to upload their own assets, synthetics service 320 can ingest the user data and verify compatibility with the simulation system.

Sensors/Devices plugin system so a user can implement custom sensors and device logics.

Synthetic simulation setup and environment manipulation for assembling the input to the simulation. A user can use assets in storage medium 340 to create and manipulate virtual environments, add devices or sensors in the environment, and define device/sensor movements.

Synthetic simulation enabling a user to run the experiment that has been set up, monitor the progress, and collect the results.

The generated synthetic imagery, scene data and other associated data may then be archived in a storage medium 340 for use in the described virtual experimentation. Storage medium 340 may be in a cloud environment or may connect to a cloud storage service. As illustrated, various data sets are stored, including scene data 330, device data 332, motion data 334, asset (object) data 336, and results 338. Together the various functionalities and data are able to intake virtual objects (assets), lighting models, orchestrated motion, camera and other sensor positions, to render synthetic (virtual) scene imagery.

Figure 4:
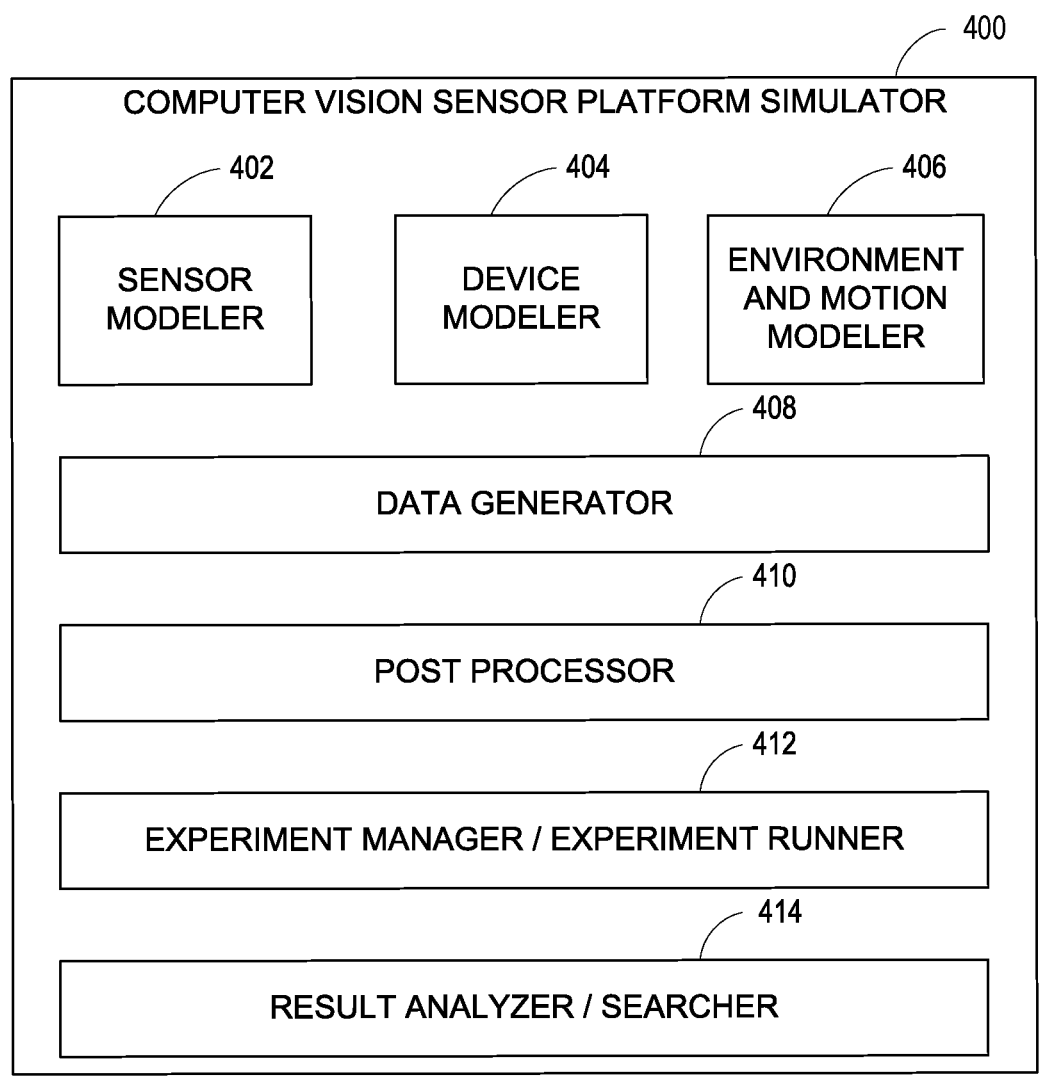
FIG. 4 is a block diagram of a computer vision sensor platform simulator suitable for implementing some of the various examples disclosed herein.

FIG. 4 is a block diagram of a CV sensor platform simulator 400. Computer vision sensor platform simulator 400 (platform simulator 400) may be implemented as a cloud service, in part or in whole, and may further be implemented on one or more computer storage devices having computer-executable instructions stored thereon for improving computer vision through simulated hardware optimization. That is, platform simulator 400 may leverage computing environments described in relation to other figures described herein. It should be understood that functionality may be allocated among the different portions in some examples differently than is described in this example.

Platform simulator 400 includes a sensor modeler 402 for modeling characteristics of one or more sensors; a device modeler 404 for modeling a device under test, wherein the modeled device under test includes the modeled characteristics of the one or more sensors; an environment and motion modeler 406 for specifying a set of synthetic operating environments and motion profiles for the modeled device under test; a data generator 408 for generating a set of synthetic experiment data, the synthetic experiment data comprising synthetic sensor frames and reference frames based on the modeled device under test and set of synthetic operating environments and motion profiles; a post processor 410 for modeling execution of computer vision algorithms applied to the set of synthetic sensor frames; an experiment manager/experiment runner 412 for iterating the generation of synthetic experiment data for differing parameters of the modeled device under test or differing synthetic operating environments and motion profiles; and a result analyzer/searcher 414 for analyzing the generated synthetic experiment data to enable identification of a desirable design configuration candidate.

In some examples, sensor modeler 402 models characteristics of multiple sensors, including cameras, electromagnetic sensors (including visible light sensors, non-visible light sensors, and wireless receivers), IMUs, audio sensors, and other range or position sensors. The modeled camera characteristics may include shot noise, mean time to failure (MTF), lens distortion, and/or quantum efficiency. Modeling of wireless receivers may include modeling of WiFi reception, including jitter, fading, and direction-of-arrival (DoA). Modeling of wireless receivers may include modeling GPS reception, decoding, and location, including location solution errors and ambiguities. Modeling of sound receivers may include modeling of acoustic ranging and detection units. Sensor modeler 402 may support parametric modeling of a wide range of base sensor components. The data for modeling may be in a library of pre-built components, or may be specified by a user.

In some examples, device modeler 404 permits users to combine two or more sensor models into a model of a device under test, possibly with support for virtual calibration and dynamic runtime recalibration of the modeled device under test. In this way, device modeler 404 creates a synthetic (virtual) device with synthetic sensors, such as a synthetic version of MR device 102 of FIG. 13. The modeling of a synthetic device may include positioning the synthetic sensors on a virtual body that may have some flexibility characteristics modeled. For example, a virtual spatial tracking device may integrate a number of visible light cameras and a combination of other motion modeling sensors. Device modeler 404 enables users to provide an initial configuration of multiple candidate devices having different sensor sets, sensor characteristics, and sensor positioning and orientation. This permits a user to explore the performance of various design options and environmental conditions (such as lighting and motion) with a single set of experiments, thereby enabling rapid identification of a desirable design configuration candidate.

In some examples, device modeler 404 permits users to specify a target set of synthetic operating environments and motion profiles for the modeled device under test based on a library of environments and motion profiles or importing new environments. Simulated environments may include rooms with objects and outdoor areas. Simulated motion may include smooth motion at various speeds and erratic motion, such as shaking or vibration. Environments and motions may be fully synthetically generated or may be imported from real-world images, recordings, and measurements.

In some examples, data generator 408 takes inputs from sensor modeler 402, device modeler 404, and environment and motion modeler 406 to generate synthetic experiment data sets. The synthetic experiment data sets may including sensor frames, such as synthetic imagery from the modeled camera or cameras, and synthetic sensor data, such as modeled IMU data, and also reference frames that are based on the sensor model, device model, environments and motions and perhaps other user input.

An integration framework can simulate execution of a model of various computer vision algorithms on various modeled processors, such as general purpose CPUs or custom circuitry, such as perhaps dedicated processors, ASICs, or specially-programmed FPGAs, taking the synthetic imagery and sensor data as inputs. Speed, precision, accuracy, and other results may be obtained by this simulation over the potentially wide range of modeled environments and motions. In some examples, this portion of the simulation may occur within data generator 408, whereas in some examples, this portion of the simulation may occur within post processor 410. Post processor 410 enables users to create an arbitrary data package, store, and analyze data in various ways, thereby integrating the virtual testing of silicon and algorithms along with evaluation of the results.

Experiment manager 412 permits a user to specify which sensor or device parameters are to be varied for differing candidate hardware configuration, along with the set of environments and motions to be used. In some examples, result analyzer 414 compares results of algorithms performed on synthetic images with data extracted from the reference frames for example, camera pointing data. In some examples, result analyzer 414 may make a recommendation of a desirable candidate, whereas in some other examples, synthetic experiment data is output for human analysis and decision-making. In some examples, a result analysis may reduce to a relatively simple search problem for relatively optimal results.

Figure 5:
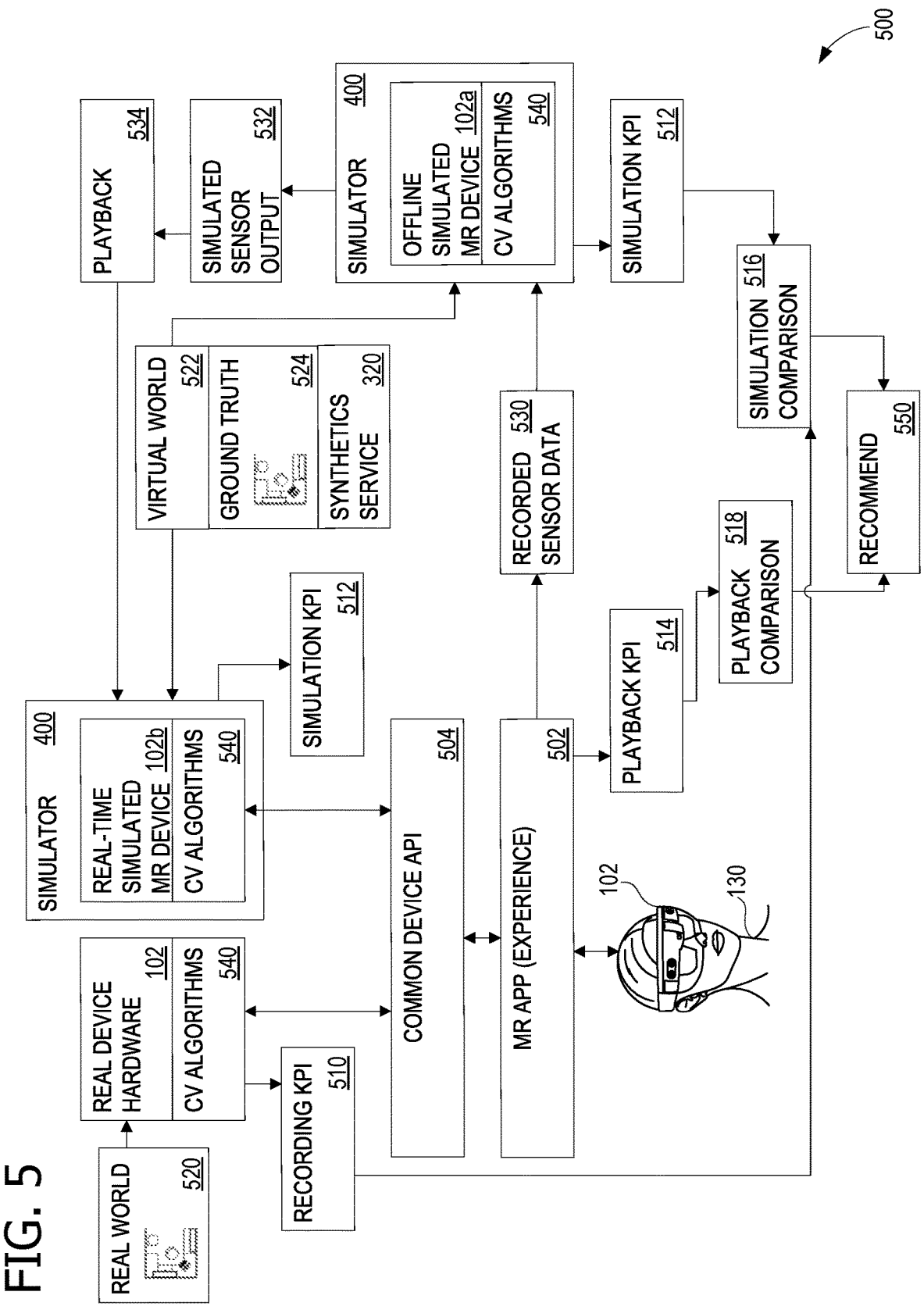
FIG. 5 is a block diagram of an immersive feedback loop suitable for experience driven development of MR devices.

FIG. 5 is a block diagram of an immersive feedback loop 500 suitable for experience driven development of MR devices. Feedback loop 500 provides the ability to simulate virtual environments and devices, and the ability to simulate an MR (or AR or VR) device in a MR (or VR) environment, with a common interface, in order to develop the MR experience. One or more computer storage devices has computer-executable instructions stored thereon for performing the operations described for feedback loop 500.

MR device 102 is operated by user 130 in a real world environment 520, using CV algorithms 540. Any synthetic data used at this stage may be unrealistically clean, such as, for example, be free of noise. Synthetic imagery, for example, at least one virtual object, is displayed, using a MR application (app) 502 and an API 504, on MR device 102. This occurs during a recording session. During the recording session, high resolution sensor data from MR device 102 is recorded to produce recorded sensor data 530. In some examples the sensor data can include any of: camera data (optical sensor data), whether single vision or stereo vision, distance data, IR data, location data, orientation data, IMU data (accelerometer, gyroscope, magnetometer), audio data, RF data, and others. The recordings include information indicating human behavior and MR device outputs from the MR experience. This can be, for example, body/hand movement to move a virtual object, or gaze tracking to track the trajectory of a virtual object. The experience may also include stress test type data, such as the real world experience may include user 130 operating MR device 102 while running on a treadmill, in order to generate high accelerometer readings.

Also during the recording session, recording KPI data 510 is recorded. In general, Recording KPI data 510, and KPIs collected at other points within feedback loop 500 provide insight regarding which configuration parameters to adjust to optimize costs and performance. KPI collected during the recording and later simulation and playback stages can give an indication of performance at each stage. During the recording session, the production of sensors outputs, which will affect the next stages and the experience as a whole, are evaluated independently to isolate the factors that can affect results. In some examples, Recording KPI data 510 includes measurement of noise and blur of a visual sensor, and can include values dependent on the synthetics ground truth (e.g., ground truth data 524) for example comparing the depth per pixel that a depth sensor produces to the known depth values from the synthetics ground truth system. That is, in some examples, Recording KPI data 510 leverages synthetics service 320, using ground truth data 524 as represented in virtual world 522. In this manner, virtual world 522 and ground truth data 524 provide a truth model useable to generate KPIs. Recording KPI data 510 includes KPIs that are independent of the synthetics ground truth and also KPIs that are dependent on the synthetics ground truth system.

The recorded experience is then fed into a simulation. Recorded sensor data 530 is input into platform simulator 400, which includes an offline simulated MR device 102a, and a copy of CV algorithms 540. Platform simulator 400 has sufficient fidelity to produce realistic synthetic results. Platform simulator 400 simulates display data, based at least on recorded sensor data 530, for at least one virtual object on simulated MR device 102a, which has simulated sensors. Platform simulator 400 will perform this during a first simulation session, using a first configuration of simulated sensors, during a second simulation session, using a second configuration of simulated sensors, and continue until the desired experiment suite for various different simulated candidate hardware configurations is completed. In the different test, the sensors may be adjusted to change location, resolution, noise level, error rates, and other variable parameters.

Some simulations are run off-line, because the computational burden may preclude effective real-time simulation.

For example, changing from a camera that records visible light, to an IR sensor, may require computation of the virtual scene (such as scene 200 of FIG. 2) with a new ray trace calculation. Additionally, simulating changes in shutter speed (light sensor integration time) also requires performing a ray tracing operation, in some examples. The offline simulation data is recorded, and saved in simulated sensor output 532. Synthetics service 320 (of FIG. 3) provides virtual objects and ground truth data 524, used in virtual world 522 that is used for the simulations performed by platform simulator 400.

During the simulation sessions, simulation KPI data 512 is collected. Simulation KPI data 512 may include errors in distance (depth) measurements, due to image blur. Such errors can be calculated, because ground truth data 524 is known. In this stage, sensor outputs are processed to produce KPIs. For example, depth sensor images over time are processed to create a 3D map of the environment (e.g. a mesh). This created 3D map created by offline simulated MR device 102a (the collected mesh) can be compared with a known 3D map generated using ground truth data 524. Similarly as with recording KPI data 510, simulation KPI data 512 includes KPIs that are independent of the synthetics ground truth and also KPIs that are dependent on the synthetics ground truth system.

Simulated sensor output 532 is injected into a playback 534, which is experienced with real-time simulated MR device 102b running in another manifestation of platform simulator 400. Real-time simulated MR device 102b also uses CV algorithms 540, and additional simulation KPI data 512 is also collected from simulations using real-time simulated MR device 102b. For consistency and fidelity, in some examples, all of MR device 102, offline simulated MR device 102a, and real-time simulated MR device 102b use the same CV algorithms 540. Also, for consistency, the playback sessions use the same virtual world 522 as the offline simulation sessions. During each playback session, a display is generated, using MR app 502, of at least one virtual object on real-time simulated MR device 102b. In the playback sessions for each tested hardware configuration, the resulting experience can be visually inspected by a human, for both objective and subjective evaluations. For example, it may be that, with certain sensor configurations, virtual object holograms are placed in incorrect locations (as compared with ground truth data 524, or may be unstable, shifting around. Or possibly, based on the nature of MR app 502, a reconstructed mesh may differ from a mesh generated when using higher resolution sensors.

Also, during the playback sessions, playback KPI data 514 is collected. The app experience during the playback session is another point in feedback loop 500 that can be evaluated using KPIs. Playback KPI data 514 provides indications of the app experience. For example, if a virtual object hologram is placed in virtual world 522, it is possible to measure the stability of the hologram over time. Another example is placing a hologram that interacts with the environment, such as moving. The consistency of the hologram's shape can be evaluated, as well as possible collisions with other objects, whether real or virtual. These example data points provide playback KPI data 514.

KPI data forms an objective basis for scoring different candidate hardware configurations. Simulation KPI data 512 for the various configurations is compared with recording KPI data 510 to produce simulation KPI comparison data 516 for the various configurations. Additionally, playback KPI data 514 for various playback sessions can be compared with each other to produce playback KPI comparison data 518. Some KPI data, such as simulation KPI data 512 does not require real-time speed playback, since the KPIs are objective measurements. Errors and discrepancies may be observed naturally, or errors may be color-coded for highlighting. An MR device hardware configuration recommendation 550 is generated, based at least on the various simulation KPI comparison data 516, and playback KPI comparison data 518, a MR device hardware configuration recommendation. Additionally, a human operator can make subjective measurements, and thus specify the minimum acceptable hardware specifications, of the candidates tested.

Figure 6:
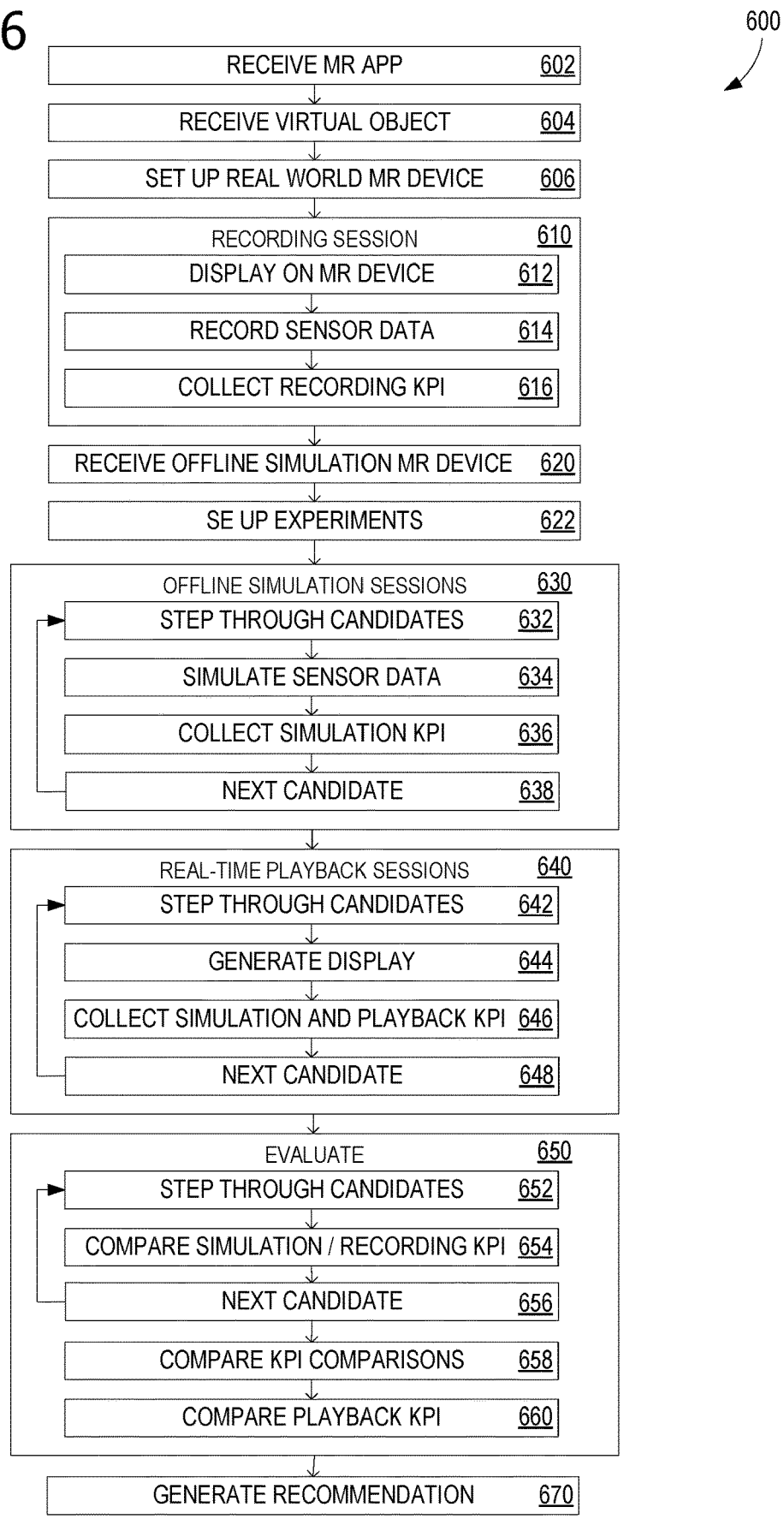
FIG. 6 is a flowchart diagram of a work flow for operating the immersive feedback loop of FIG. 5.

FIG. 6 is a flowchart diagram of a work flow 600 for illustrating an exemplary operation of feedback loop 500. An MR app (application) under development is received in operation 602, and at least one virtual object for hologram display (perhaps part of a larger virtual world) is received in operation 604. A real world MR device, with high resolution sensors, is set up in operation 606, and a recording session 610 may then begin. During recording session 610, the MR device displays the virtual object using the MR application, in operation 612. That is, operation 612 includes displaying, using an application, a virtual object on a first MR device, during a recording session. Operation 614 includes recording, during the recording session, sensor data from the first MR device, and operation 616 includes collecting recording KPI data during the recording session.

In operation 620, a sensor platform simulator then receives an offline simulated MR device, perhaps as a data file or set of data files, so that it can perform simulations. Experiments are set up in operation 622, such as specifying a set of configuration candidates with various combinations of (simulated) sensors. For example, cameras having different resolutions, and accelerometers having different dynamic ranges, may be specified as alternative hardware configuration candidates.

Off-line simulation sessions may then begin in operation 630. Operation 632 steps through the different configuration candidates, performing a simulation for each, as specified in the experiment setup. For each candidate simulated, operation 634 includes simulating sensor data, based at least on the recorded sensor data, for the virtual object on the current offline simulated MR device having simulated sensors, during the simulation session. Operation 636 includes collecting simulation KPI data during the simulation session. Operations 634 and 636 are repeated for each next configuration candidate until operation 638 determines that the experiments are complete for this stage. That is, when there is a plurality of configuration candidates (e.g., different camera resolutions or IMU precision), operation 636 includes collecting simulation KPI data during the simulation session for a plurality of configuration candidates, each having a specified combination of simulated sensors.

Playback sessions and real-time simulations may then begin in operation 640. Operation 642 steps through the different configuration candidates, performing a playback for each, as specified in the experiment setup. For each candidate simulated, operation 644 includes generating a display, using the application, of the virtual object on the current real-time simulated MR device, during the playback session. Operation 646 includes collecting playback KPI data during the playback session, and additional simulation KPI data. Operations 644 and 646 are repeated for each next configuration candidate until operation 648 determines that the experiments are complete for this stage.

Evaluation begins in operation 650. Operation 652 steps through the different configuration candidates, and operation 654 includes, for the various candidates, comparing the simulation KPI data with the recording KPI data to produce simulation KPI comparison data. Operation 656 determines when the comparisons are complete for this stage. Operation 658 includes comparing the simulation KPI comparison data across the different candidates. For example, the simulation KPI comparison data for a first candidate will be compared with the simulation KPI comparison data for a second candidate, and a third candidate, and so on. In this manner, the candidate configurations can be ranked according to how well their simulation KPI data matches the recorded KPI data. Operation 660 includes comparing the playback KPI data across candidates. That is, operation 660 includes comparing the playback KPI data for a first candidate with the playback KPI data for a second candidate to produce playback KPI comparison data, and for a third candidate, and so on.

With the KPI providing objective scoring criteria, an objective recommendation is possible, in addition to a human's subjective determinations. Thus operation 670 includes generating, based at least on the first simulation KPI comparison data, the second simulation KPI comparison data, and the playback KPI comparison data, a MR device hardware configuration recommendation. In some examples, operation 670 also includes adjusting a score or making a recommendation or pass/fail assessment based on human input.

Additional Examples

Some aspects and examples disclosed herein are directed to a system for simulating an MR device comprising: a processor; and a computer-readable medium storing instructions that are operative when executed by the processor to: display, using an application, a virtual object on a first MR device, during a recording session; record, during the recording session, sensor data from the first MR device; simulate sensor data, based at least on the recorded sensor data, for the virtual object on a simulated MR device having simulated sensors, during a simulation session; and generate a display, using the application, of the virtual object on the simulated MR device, during a playback session.

Additional aspects and examples disclosed herein are directed to a process for simulating an MR device comprising: displaying, using an application, a virtual object on a first MR device, during a recording session; recording, during the recording session, sensor data from the first MR device; simulating sensor data, based at least on the recorded sensor data, for the virtual object on a first offline simulated MR device having a first combination of simulated sensors, during a first simulation session; and generating a display, using the application, of the virtual object on a first real-time simulated MR device, during a first playback session.

Additional aspects and examples disclosed herein are directed to a one or more computer storage devices having computer-executable instructions stored thereon for simulating an MR device, which, on execution by a computer, cause the computer to perform operations that comprise: displaying, using an application, a virtual object on a first MR device, during a recording session; recording, during the recording session, sensor data from the first MR device; collecting recording key performance indicator (KPI) data during the recording session; simulating sensor data, based at least on the recorded sensor data, for the virtual object on a first offline simulated MR device having a first combination of simulated sensors, during a first simulation session; collecting first simulation KPI data during the first simulation session; comparing the first simulation KPI data with the recording KPI data to produce first simulation KPI comparison data; simulating sensor data, based at least on the recorded sensor data, for the virtual object on a second offline simulated MR device having a second combination of simulated sensors, during a second simulation session; collecting second simulation KPI data during the second simulation session; comparing the second simulation KPI data with the recording KPI data to produce second simulation KPI comparison data; generating a display, using the application, of the virtual object on a first real-time simulated MR device, during a first playback session; collecting first playback KPI data during the first playback session; generating a display, using the application, of the virtual object on a second real-time simulated MR device, during a second playback session; collecting second playback KPI data during the second playback session; and comparing the first playback KPI data with the second playback KPI data to produce playback KPI comparison data.

Alternatively, or in addition to the other examples described herein, examples include any combination of the following:

- the sensor data comprises optical sensor data;
- the sensor data comprises distance data;
- the sensor data comprises orientation data;
- the sensor data comprises IMU data;
- the sensor data comprises audio data;
- collecting simulation KPI data during the simulation session;
- comparing the simulation KPI data with the recording KPI data to produce simulation KPI comparison data;
- collecting first simulation KPI data during the first simulation session;
- comparing the first simulation KPI data with the recording KPI data to produce first simulation KPI comparison data;
- simulating sensor data, based at least on the recorded sensor data, for the virtual object on a second offline simulated MR device having a second combination of simulated sensors, during a second simulation session;
- collecting second simulation KPI data during the second simulation session;
- collecting simulation KPI data during the simulation session for a plurality of configuration candidates, each having a specified combination of simulated sensors;
- comparing the second simulation KPI data with the recording KPI data to produce second simulation KPI comparison data;
- collecting playback KPI data during the playback session;
- collecting first playback KPI data during the first playback session;
- generating a display, using the application, of the virtual object on a second real-time simulated MR device, during a second playback session;
- collecting second playback KPI data during the second playback session;
- comparing the first playback KPI data with the second playback KPI data to produce playback KPI comparison data; and
- generating, based at least on the first simulation KPI comparison data, the second simulation KPI comparison data, and the playback KPI comparison data, a MR device hardware configuration recommendation.

While the aspects of the disclosure have been described in terms of various examples with their associated operations, a person skilled in the art would appreciate that a combination of operations from any number of different examples is also within scope of the aspects of the disclosure.

Example Operating Environment

Figure 7:
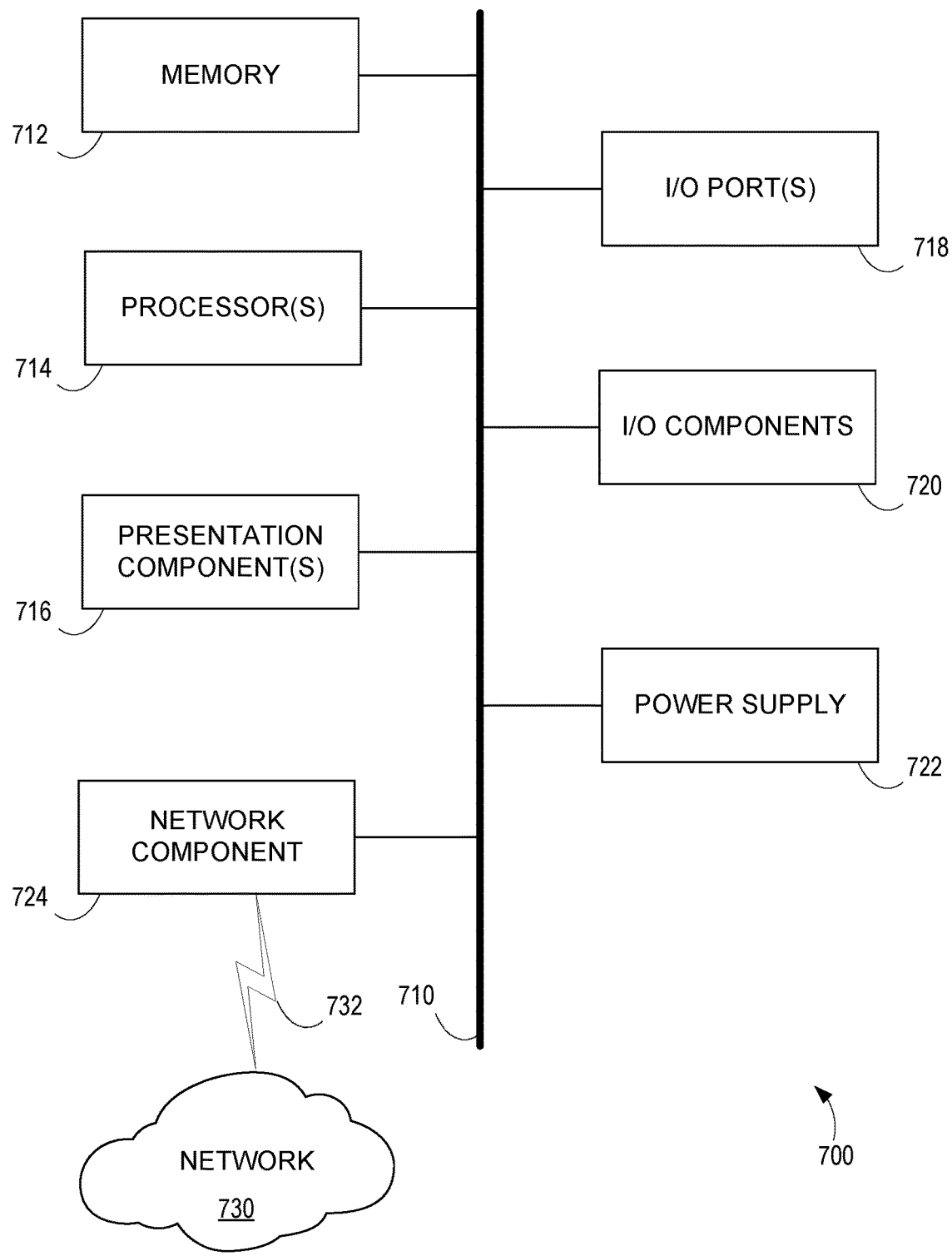
FIG. 7 is a block diagram of an example computing environment suitable for implementing some of the various examples disclosed herein.

FIG. 7 is a block diagram of an example computing device 700 for implementing aspects disclosed herein, and is designated generally as computing device 700. Computing device 700 is but one example of a suitable computing environment and is not intended to suggest any limitation as to the scope of use or functionality of the examples disclosed herein. Neither should the computing device 700 be interpreted as having any dependency or requirement relating to any one or combination of components/modules illustrated. The examples disclosed herein may be described in the general context of computer code or machine-useable instructions, including computer-executable instructions such as program components, being executed by a computer or other machine, such as a personal data assistant or other handheld device. Generally, program components including routines, programs, objects, components, data structures, and the like, refer to code that performs particular tasks, or implement particular abstract data types. The discloses examples may be practiced in a variety of system configurations, including personal computers, laptops, smart phones, mobile tablets, hand-held devices, consumer electronics, specialty computing devices, etc. The disclosed examples may also be practiced in distributed computing environments, such as those disclosed in FIG. 8 described in more detail below, where tasks are performed by remote-processing devices that are linked through a communications network.

Computing device 700 includes a bus 710 that directly or indirectly couples the following devices: computer-storage memory 712, one or more processors 714, one or more presentation components 716, input/output (I/O) ports 718, I/O components 720, a power supply 722, and a network component 724. Computer device 700 should not be interpreted as having any dependency or requirement related to any single component or combination of components illustrated therein. While computer device 700 is depicted as a seemingly single device, multiple computing devices 700 may work together and share the depicted device resources. For instance, computer-storage memory 712 may be distributed across multiple devices, processor(s) 714 may provide housed on different devices, and so on.

Bus 710 represents what may be one or more busses (such as an address bus, data bus, or a combination thereof). Although the various blocks of FIG. 7 are shown with lines for the sake of clarity, in reality, delineating various components is not so clear, and metaphorically, the lines would more accurately be grey and fuzzy. For example, one may consider a presentation component such as a display device to be an I/O component. Also, processors have memory. Such is the nature of the art, and reiterate that the diagram of FIG. 7 is merely illustrative of an exemplary computing device that can be used in connection with one or more disclosed examples. Distinction is not made between such categories as "workstation," "server," "laptop," "hand-held device," etc., as all are contemplated within the scope of FIG. 7 and the references herein to a "computing device." Computer-storage memory 712 may take the form of the computer-storage media references below and operatively provide storage of computer-readable instructions, data structures, program modules and other data for the computing device 700. For example, computer-storage memory 712 may store an operating system, a universal application platform, or other program modules and program data. Computer-storage memory 712 may be used to store and access instructions configured to carry out the various operations disclosed herein.

As mentioned below, computer-storage memory 712 may include computer-storage media in the form of volatile and/or nonvolatile memory, removable or non-removable memory, data disks in virtual environments, or a combination thereof And computer-storage memory 712 may include any quantity of memory associated with or accessible by the computing device 700. The memory 712 may be internal to the computing device 700 (as shown in FIG. 7), external to the computing device 700 (not shown), or both (not shown). Examples of memory 712 in include, without limitation, random access memory (RAM); read only memory (ROM); electronically erasable programmable read only memory (EEPROM); flash memory or other memory technologies; CDROM, digital versatile disks (DVDs) or other optical or holographic media; magnetic cassettes, magnetic tape, magnetic disk storage or other magnetic storage devices; memory wired into an analog computing device; or any other medium for encoding desired information and for access by the computing device 700. Additionally or alternatively, the computer-storage memory 712 may be distributed across multiple computing devices 700, e.g., in a virtualized environment in which instruction processing is carried out on multiple devices 700. For the purposes of this disclosure, "computer storage media," "computer-storage memory," "memory," and "memory devices" are synonymous terms for the computer-storage memory 712, and none of these terms include carrier waves or propagating signaling.

Processor(s) 714 may include any quantity of processing units that read data from various entities, such as memory 712 or I/O components 720. Specifically, processor(s) 714 are programmed to execute computer-executable instructions for implementing aspects of the disclosure. The instructions may be performed by the processor, by multiple processors within the computing device 700, or by a processor external to the client computing device 700. In some examples, the processor(s) 714 are programmed to execute instructions such as those illustrated in the flowcharts discussed below and depicted in the accompanying drawings. Moreover, in some examples, the processor(s) 714 represent an implementation of analog techniques to perform the operations described herein. For example, the operations may be performed by an analog client computing device 700 and/or a digital client computing device 700. Presentation component(s) 716 present data indications to a user or other device. Exemplary presentation components include a display device, speaker, printing component, vibrating component, etc. One skilled in the art will understand and appreciate that computer data may be presented in a number of ways, such as visually in a graphical user interface (GUI), audibly through speakers, wirelessly between computing devices 700, across a wired connection, or in other ways. Ports 718 allow computing device 700 to be logically coupled to other devices including I/O components 720, some of which may be built in. Examples I/O components 720 include, for example but without limitation, a microphone, joystick, game pad, satellite dish, scanner, printer, wireless device, etc.

The computing device 700 may operate in a networked environment via the network component 724 using logical connections to one or more remote computers. In some examples, the network component 724 includes a network interface card and/or computer-executable instructions (e.g., a driver) for operating the network interface card. Communication between the computing device 700 and other devices may occur using any protocol or mechanism over any wired or wireless connection. In some examples, the network component 724 is operable to communicate data over public, private, or hybrid (public and private) using a transfer protocol, between devices wirelessly using short range communication technologies (e.g., near-field communication (NFC), Bluetooth™ branded communications, or the like), or a combination thereof. For example, network component 724 communicates over communication link 732 with network 730, that may be any of a public network 802, a private network 804, and a dedicated network 806 (see FIG. 8).

Figure 8:
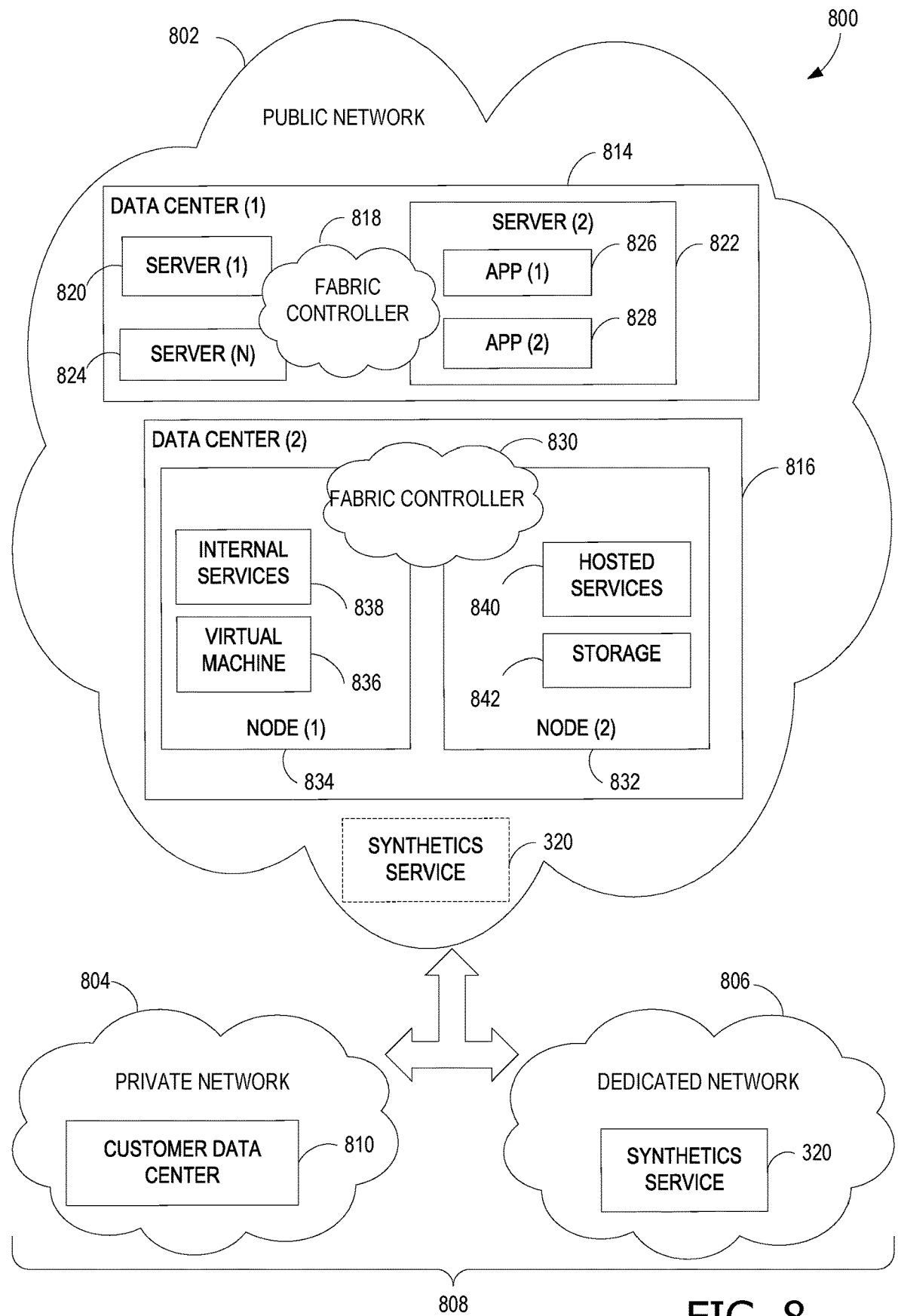
FIG. 8 is a block diagram of an example cloud-computing infrastructure suitable for implementing some of the various examples disclosed herein.

Turning now to FIG. 8, an exemplary block diagram illustrates a cloud-computing architecture 800, suitable for use in implementing aspects of this disclosure. Architecture 800 should not be interpreted as having any dependency or requirement related to any single component or combination of components illustrated therein. In addition, any number of nodes, virtual machines, data centers, role instances, or combinations thereof may be employed to achieve the desired functionality within the scope of examples of the present disclosure. The distributed computing environment of FIG. 8 includes a public network 802, a private network 804, and a dedicated network 806. Public network 802 may be a public cloud-based network of computing resources, for example. Private network 804 may be a private enterprise network or private cloud-based network of computing resources. And dedicated network 806 may be a third-party network or dedicated cloud-based network of computing resources. In some examples, public network 802 may host cloud synthetics service 320 (of FIG. 3). In some examples, private network 804 may host a customer data center 810, and dedicated network 806 may host cloud synthetics service 320 (of FIG. 3).

Hybrid cloud 808 may include any combination of public network 802, private network 804, and dedicated network 806. For example, dedicated network 806 may be optional, with hybrid cloud 808 comprised of public network 802 and private network 804. Along these lines, some customers may opt to only host a portion of their customer data center 810 in the public network 802 and/or dedicated network 806, retaining some of the customers' data or hosting of customer services in the private network 804. For example, a customer that manages healthcare data or stock brokerage accounts may elect or be required to maintain various controls over the dissemination of healthcare or account data stored in its data center or the applications processing such data (e.g., software for reading radiology scans, trading stocks, etc.). Myriad other scenarios exist whereby customers may desire or need to keep certain portions of data centers under the customers' own management. Thus, in some examples, customer data centers may use a hybrid cloud 808 in which some data storage and processing is performed in the public network 802 while other data storage and processing is performed in the dedicated network 806.

Public network 802 may include data centers configured to host and support operations, including tasks of a distributed application, according to the fabric controller 818. It will be understood and appreciated that data center 814 and data center 816 shown in FIG. 8 are merely examples of suitable implementations for accommodating one or more distributed applications, and are not intended to suggest any limitation as to the scope of use or functionality of examples disclosed herein. Neither should data center 814 and data center 816 be interpreted as having any dependency or requirement related to any single resource, combination of resources, combination of servers (e.g., servers 820 and 824) combination of nodes (e.g., nodes 832 and 834), or a set of APIs to access the resources, servers, and/or nodes.

Data center 814 illustrates a data center comprising a plurality of servers, such as servers 820 and 824. A fabric controller 818 is responsible for automatically managing the servers 820 and 824 and distributing tasks and other resources within the data center 814. By way of example, the fabric controller 818 may rely on a service model (e.g., designed by a customer that owns the distributed application) to provide guidance on how, where, and when to configure server 822 and how, where, and when to place application 826 and application 828 thereon. One or more role instances of a distributed application may be placed on one or more of the servers 820 and 824 of data center 814, where the one or more role instances may represent the portions of software, component programs, or instances of roles that participate in the distributed application. In other examples, one or more of the role instances may represent stored data that are accessible to the distributed application.

Data center 816 illustrates a data center comprising a plurality of nodes, such as node 832 and node 834. One or more virtual machines may run on nodes of data center 816, such as virtual machine 836 of node 834 for example. Although FIG. 8 depicts a single virtual node on a single node of data center 816, any number of virtual nodes may be implemented on any number of nodes of the data center in accordance with illustrative examples of the disclosure. Generally, virtual machine 836 is allocated to role instances of a distributed application, or service application, based on demands (e.g., amount of processing load) placed on the distributed application. As used herein, the phrase "virtual machine" is not meant to be limiting, and may refer to any software, application, operating system, or program that is executed by a processing unit to underlie the functionality of the role instances allocated thereto. Further, the virtual machine(s) 836 may include processing capacity, storage locations, and other assets within the data center 816 to properly support the allocated role instances.

In operation, the virtual machines are dynamically assigned resources on a first node and second node of the data center, and endpoints (e.g., the role instances) are dynamically placed on the virtual machines to satisfy the current processing load. In one instance, a fabric controller 830 is responsible for automatically managing the virtual machines running on the nodes of data center 816 and for placing the role instances and other resources (e.g., software components) within the data center 816. By way of example, the fabric controller 830 may rely on a service model (e.g., designed by a customer that owns the service application) to provide guidance on how, where, and when to configure the virtual machines, such as virtual machine 836, and how, where, and when to place the role instances thereon.

As described above, the virtual machines may be dynamically established and configured within one or more nodes of a data center. As illustrated herein, node 832 and node 834 may be any form of computing devices, such as, for example, a personal computer, a desktop computer, a laptop computer, a mobile device, a consumer electronic device, a server, the computing device 700 of FIG. 7, and the like. In one instance, the nodes 832 and 834 host and support the operations of the virtual machine(s) 836, while simultaneously hosting other virtual machines carved out for supporting other tenants of the data center 816, such as internal services 838, hosted services 840, and storage 842. Often, the role instances may include endpoints of distinct service applications owned by different customers.

Typically, each of the nodes include, or is linked to, some form of a computing unit (e.g., central processing unit, microprocessor, etc.) to support operations of the component(s) running thereon. As utilized herein, the phrase "computing unit" generally refers to a dedicated computing device with processing power and storage memory, which supports operating software that underlies the execution of software, applications, and computer programs thereon. In one instance, the computing unit is configured with tangible hardware elements, or machines, that are integral, or operably coupled, to the nodes to enable each device to perform a variety of processes and operations. In another instance, the computing unit may encompass a processor (not shown) coupled to the computer-readable medium (e.g., computer storage media and communication media) accommodated by each of the nodes.

The role of instances that reside on the nodes may be to support operation of service applications, and thus they may be interconnected via APIs. In one instance, one or more of these interconnections may be established via a network cloud, such as public network 802. The network cloud serves to interconnect resources, such as the role instances, which may be distributed across various physical hosts, such as nodes 832 and 834. In addition, the network cloud facilitates communication over channels connecting the role instances of the service applications running in the data center 816. By way of example, the network cloud may include, without limitation, one or more communication networks, such as local area networks (LANs) and/or wide area networks (WANs). Such communication networks are commonplace in offices, enterprise-wide computer networks, intranets, and the Internet, and therefore need not be discussed at length herein.

Although described in connection with an example computing device 700, examples of the disclosure are capable of implementation with numerous other general-purpose or special-purpose computing system environments, configurations, or devices. Examples of well-known computing systems, environments, and/or configurations that may be suitable for use with aspects of the disclosure include, but are not limited to, smart phones, mobile tablets, mobile computing devices, personal computers, server computers, hand-held or laptop devices, multiprocessor systems, gaming consoles, microprocessor-based systems, set top boxes, programmable consumer electronics, mobile telephones, mobile computing and/or communication devices in wearable or accessory form factors (e.g., watches, glasses, headsets, or earphones), network PCs, minicomputers, mainframe computers, distributed computing environments that include any of the above systems or devices, VR devices, holographic device, and the like. Such systems or devices may accept input from the user in any way, including from input devices such as a keyboard or pointing device, via gesture input, proximity input (such as by hovering), and/or via voice input.

Examples of the disclosure may be described in the general context of computer-executable instructions, such as program modules, executed by one or more computers or other devices in software, firmware, hardware, or a combination thereof. The computer-executable instructions may be organized into one or more computer-executable components or modules. Generally, program modules include, but are not limited to, routines, programs, objects, components, and data structures that perform particular tasks or implement particular abstract data types. Aspects of the disclosure may be implemented with any number and organization of such components or modules. For example, aspects of the disclosure are not limited to the specific computer-executable instructions or the specific components or modules illustrated in the figures and described herein. Other examples of the disclosure may include different computer-executable instructions or components having more or less functionality than illustrated and described herein. In examples involving a general-purpose computer, aspects of the disclosure transform the general-purpose computer into a special-purpose computing device when configured to execute the instructions described herein.

By way of example and not limitation, computer readable media comprise computer storage media and communication media. Computer storage media include volatile and nonvolatile, removable and non-removable memory implemented in any method or technology for storage of information such as computer readable instructions, data structures, program modules, or the like. Computer storage media are tangible and mutually exclusive to communication media. Computer storage media are implemented in hardware and exclude carrier waves and propagated signals. Computer storage media for purposes of this disclosure are not signals per se. Exemplary computer storage media include hard disks, flash drives, solid-state memory, phase change random-access memory (PRAM), static random-access memory (SRAM), dynamic random-access memory (DRAM), other types of random-access memory (RAM), read-only memory (ROM), electrically erasable programmable read-only memory (EEPROM), flash memory or other memory technology, compact disk read-only memory (CD-ROM), digital versatile disks (DVD) or other optical storage, magnetic cassettes, magnetic tape, magnetic disk storage or other magnetic storage devices, or any other non-transmission medium that can be used to store information for access by a computing device. In contrast, communication media typically embody computer readable instructions, data structures, program modules, or the like in a modulated data signal such as a carrier wave or other transport mechanism and include any information delivery media.

The order of execution or performance of the operations in examples of the disclosure illustrated and described herein is not essential, and may be performed in different sequential manners in various examples. For example, it is contemplated that executing or performing a particular operation before, contemporaneously with, or after another operation is within the scope of aspects of the disclosure. When introducing elements of aspects of the disclosure or the examples thereof, the articles "a," "an," "the," and "said" are intended to mean that there are one or more of the elements. The terms "comprising," "including," and "having" are intended to be inclusive and mean that there may be additional elements other than the listed elements. The term "exemplary" is intended to mean "an example of." The phrase "one or more of the following: A, B, and C" means "at least one of A and/or at least one of B and/or at least one of C."

Having described aspects of the disclosure in detail, it will be apparent that modifications and variations are possible without departing from the scope of aspects of the disclosure as defined in the appended claims. As various changes could be made in the above constructions, products, and methods without departing from the scope of aspects of the disclosure, it is intended that all matter contained in the above description and shown in the accompanying drawings shall be interpreted as illustrative and not in a limiting sense.

What is claimed is:

1. A system for simulating a mixed reality (MR) device, the system comprising:
   a processor; and
   a computer-readable medium storing instructions that are operative when executed by the processor to:
      display, using an application, a virtual object on a first MR device, during a recording session;
      record, during the recording session, sensor data from the first MR device;

simulate sensor data, based at least on the recorded sensor data, for the virtual object on a simulated MR device having simulated sensors, during a simulation session; and generate a display, using the application, of the virtual object on the simulated MR device, during a playback session.

2. The system of claim 1 wherein the sensor data comprises optical sensor data.

3. The system of claim 1 wherein the sensor data comprises distance data.

4. The system of claim 1 wherein the sensor data comprises inertial measurement unit (IMU) data.

5. The system of claim 1 wherein the instructions are further operative to:

collect recording key performance indicator (KPI) data during the recording session.

6. The system of claim 5 wherein the instructions are further operative to:

collect simulation KPI data during the simulation session; and compare the simulation KPI data with the recording KPI data to produce simulation KPI comparison data.

7. The system of claim 1 wherein the instructions are further operative to:

collect simulation key performance indicator (KPI) data during the simulation session for a plurality of configuration candidates, each having a specified combination of simulated sensors.

8. The system of claim 1 wherein the instructions are further operative to:

collect playback key performance indicator (KPI) data during the playback session.

9. A method of simulating a mixed reality (MR) device, the method comprising:

displaying, using an application, a virtual object on a first MR device, during a recording session;

recording, during the recording session, sensor data from the first MR device;

simulating sensor data, based at least on the recorded sensor data, for the virtual object on a first offline simulated MR device having a first combination of simulated sensors, during a first simulation session; and generating a display, using the application, of the virtual object on a first real-time simulated MR device, during a first playback session.

10. The method of claim 9 wherein the sensor data comprises optical sensor data.

11. The method of claim 9 wherein the sensor data comprises distance data.

12. The method of claim 9 wherein the sensor data comprises orientation data.

13. The method of claim 9 wherein the sensor data comprises inertial measurement unit (IMU) data.

14. The method of claim 9 further comprising:

simulating sensor data, based at least on the recorded sensor data, for the virtual object on a second offline simulated MR device having a second combination of simulated sensors, during a second simulation session; and generating a display, using the application, of the virtual object on a second real-time simulated MR device, during a second playback session.

15. The method of claim 14 further comprising:

collecting recording key performance indicator (KPI) data during the recording session;

collecting first simulation KPI data during the first simulation session; and collecting second simulation KPI data during the second simulation session.

16. The method of claim 15 further comprising:

comparing the first simulation KPI data with the recording KPI data to produce first simulation KPI comparison data; and comparing the second simulation KPI data with the recording KPI data to produce second simulation KPI comparison data.

17. The method of claim 14 further comprising:

collecting first playback KPI data during the first playback session;

collecting second playback KPI data during the second playback session; and comparing the first playback KPI data with the second playback KPI data to produce playback KPI comparison data.

18. One or more computer storage devices having computer-executable instructions stored thereon for simulating a mixed reality (MR) device, which, on execution by a computer, cause the computer to perform operations comprising:

displaying, using an application, a virtual object on a first MR device, during a recording session;

recording, during the recording session, sensor data from the first MR device;

collecting recording key performance indicator (KPI) data during the recording session;

simulating sensor data, based at least on the recorded sensor data, for the virtual object on a first offline simulated MR device having a first combination of simulated sensors, during a first simulation session;

collecting first simulation KPI data during the first simulation session;

comparing the first simulation KPI data with the recording KPI data to produce first simulation KPI comparison data;

simulating sensor data, based at least on the recorded sensor data, for the virtual object on a second offline simulated MR device having a second combination of simulated sensors, during a second simulation session;

collecting second simulation KPI data during the second simulation session;

comparing the second simulation KPI data with the recording KPI data to produce second simulation KPI comparison data;

generating a display, using the application, of the virtual object on a first real-time simulated MR device, during a first playback session;

collecting first playback KPI data during the first playback session;

generating a display, using the application, of the virtual object on a second real-time simulated MR device, during a second playback session;

collecting second playback KPI data during the second playback session; and comparing the first playback KPI data with the second playback KPI data to produce playback KPI comparison data.

19. The one or more computer storage devices of claim 18 wherein the sensor data comprises audio data.

20. The one or more computer storage devices of claim 18 wherein the operations further comprise:

generating, based at least on the first simulation KPI comparison data, the second simulation KPI comparison data, and the playback KPI comparison data, a MR device hardware configuration recommendation.

* * * * *